(12) United States Patent
Yang

(10) Patent No.: US 6,730,544 B1
(45) Date of Patent: May 4, 2004

(54) STACKABLE SEMICONDUCTOR PACKAGE AND METHOD FOR MANUFACTURING SAME

(75) Inventor: Jun Young Yang, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 13 days.

(21) Appl. No.: 09/687,530

(22) Filed: Oct. 13, 2000

(30) Foreign Application Priority Data

Dec. 20, 1999 (KR) ........................................ 1999-59347

(51) Int. Cl.[7] .................... H01L 21/44; H01L 21/48; H01L 21/50
(52) U.S. Cl. .................. 438/110; 438/106; 438/109; 438/112; 438/25; 438/51; 438/55; 438/64; 438/123; 438/124; 438/127; 257/678; 257/686; 257/687
(58) Field of Search .................... 438/106–112, 25, 438/51–55, 64, 121–27; 257/678, 686–688

(56) References Cited

U.S. PATENT DOCUMENTS

| | | | |
|---|---|---|---|
| 4,530,152 A | 7/1985 | Roche et al. | 29/588 |
| 5,041,902 A | 8/1991 | McShane | 357/79 |
| 5,157,480 A | 10/1992 | McShane et al. | 357/74 |
| 5,172,213 A | 12/1992 | Zimmerman | 257/796 |
| 5,172,214 A | 12/1992 | Casto | 257/676 |
| 5,278,446 A | 1/1994 | Nagaraj et al. | 257/707 |
| 5,335,771 A | * 8/1994 | Murphy | 206/328 |
| 5,428,248 A | 6/1995 | Cha | 257/676 |
| 5,471,088 A | * 11/1995 | Song | 257/668 |
| 5,521,429 A | 5/1996 | Aono et al. | 257/676 |
| 5,701,034 A | 12/1997 | Marrs | 257/706 |
| 5,783,861 A | 7/1998 | Son | 253/693 |

(List continued on next page.)

FOREIGN PATENT DOCUMENTS

| | | |
|---|---|---|
| JP | 57-45959 | 3/1982 |
| JP | 58-101317 | 6/1983 |
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

OTHER PUBLICATIONS

S.F Sarawi et al. "A review of 3–d packaging" IEEE Transactions on components packaging and Manufacturing Technology vol. 21 #1 Feb. 1998 p. 2–14.*

Primary Examiner—Matthew Smith
Assistant Examiner—Granvill D Lee
(74) Attorney, Agent, or Firm—Stetina Brunda Garred & Brucker

(57) ABSTRACT

A stackable semiconductor package having a lead frame, a plurality of electrical paths, and a sealing material. The leadframe has a plurality of leads, each one of the plurality of leads having a top portion exposed to a top surface of the semiconductor package and a bottom portion resting flush with a bottom surface of the semiconductor package. In this manner, the leads extending from the top surface to the bottom surface of the semiconductor package provide an electrical path for connecting and electrically powering a second semiconductor package stacked on top of a first bottom semiconductor package.

21 Claims, 6 Drawing Sheets

U.S. PATENT DOCUMENTS

| | | | |
|---|---|---|---|
| 5,821,457 A | * 10/1998 | Mosley et al. | 174/52.4 |
| 5,835,988 A | 11/1998 | Ishii | 257/684 |
| 5,866,939 A | 2/1999 | Shin et al. | 257/666 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 6,143,981 A | 11/2000 | Glenn | 174/52.4 |
| 6,229,200 B1 | 5/2001 | Mclellan et al. | 257/666 |
| 6,242,281 B1 | 6/2001 | Mclellan et al. | 438/106 |
| 6,294,100 B1 | 9/2001 | Fan et al. | 216/14 |
| 6,297,548 B1 | * 10/2001 | Moden et al. | 257/686 |
| 6,355,502 B1 | 3/2002 | Kang et al. | 438/110 |
| 2002/0100963 A1 | * 8/2002 | Suzuki et al. | 257/678 |

* cited by examiner

STACKABLE SEMICONDUCTOR PACKAGE AND METHOD FOR MANUFACTURING SAME

BACKGROUND OF THE INVENTION

1. Field of the Invention

The present invention relates to semiconductor packages, leadframe assemblies therefor and a method of manufacture, and more particularly, but not by way of limitation, to a stackable semiconductor package and a method for manufacturing the same.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal lead frames for supporting an integrated circuit chip which is bonded to a chip paddle region formed centrally therein. Bond wires which electrically connect pads on the integrated circuit chip to individual leads of the lead frame are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a lead frame as the central supporting structure of such a package. A portion of the lead frame completely surrounded by the plastic encapsulant is internal to the package. Portions of the lead frame extend internally from the package and are then used to connect the package externally. More information relative to lead frame technology may be found in Chapter 8 of the book Micro Electronics Packaging Handbook, (1989), edited by R. Tummala and E. Rymaszewski, incorporated by reference herein. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a printed circuit board on which a significant number of such semiconductor packages are secured to provide multiple electronic functions. These electronic appliances are typically manufactured in reduced sizes and at reduced costs, which results in increased consumer demand. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to printed circuit boards and support the semiconductor chips on the printed circuit boards, have been designed to have a small size. By way of example only, such semiconductor packages may have a size on the order of 1×1 mm to 10×10 mm.

Even though semiconductor packages have been miniaturized, space on a printed circuit board remains limited and precious. Thus, there is a need to find both a method and a carrier package design to maximize the number of semiconductor packages that can be fitted onto an electronic device, yet minimize the space needed to attach these semiconductor packages. One method to minimize the space needed to attach the semiconductor packages is to stack the semiconductor packages on top of each other.

BRIEF SUMMARY OF THE INVENTION

The present invention relates to stackable semiconductor packages and methods for manufacturing the same. More particularly, one aspect of various embodiments of the present invention comprises a semiconductor package wherein the semiconductor package includes a lead frame, a semiconductor chip, a plurality of electrical paths electrically connecting the semiconductor chip to the leadframe, and a sealing material. The leadframe has a plurality of leads, each one of the plurality of leads having a top portion exposed to a top surface of the semiconductor package and a bottom portion resting flush with a bottom surface of the semiconductor package. In this manner, the leads extending from the top to the bottom surface of the semiconductor package provide an electrical path for connecting and electrically powering a second semiconductor package stacked on top of a first semiconductor package.

In another aspect, the present invention relates to a method for stacking semiconductor packages. More particularly, the method comprises the steps of physically and electrically connecting a bottom surface of a first semiconductor package to a printed circuit board, the first semiconductor package having a plurality of leads, each one of the first plurality of leads having a first section exposed to a first top surface of the first semiconductor package and a second section resting flush against a first bottom surface of the first semiconductor package. A second semiconductor package is then physically and electrically connected to the top of the first semiconductor package. The second semiconductor package includes a second plurality of leads in generally the same position as the first plurality of leads.

BRIEF DESCRIPTION OF THE DRAWINGS

A more complete understanding of the semiconductor package according to the present invention may be obtained by reference to the following detailed description, with like reference numerals denoting like elements, when taken in conjunction with the accompanying drawings wherein.

The present invention may be understood more readily by reference to the following detailed description of preferred embodiments of the present invention and the figures.

DETAILED DESCRIPTION OF THE INVENTION

Figure 1:
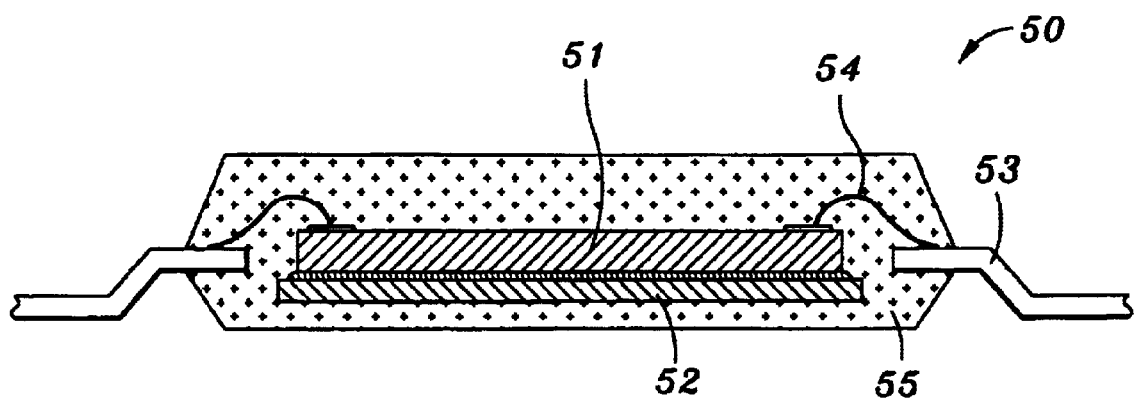
FIG. 1 is a cross-section of a prior art semiconductor package.

Referring now to FIG. 1, there is shown a cross-section of prior art semiconductor package 50. Prior art semiconductor package 50 has a semiconductor chip 51 attached to a paddle 52. Paddle 52 is a part of a leadframe.

A plurality of leads 53, also a part of the leadframe, surround but do not touch paddle 52. A plurality of wires 54 electrically connect semiconductor chip 51 to leads 53. The wires 54 are generally thin and made of gold, silver, or aluminum. The entire assembly—except for outer portions of leads 53—is enclosed by a nonconducting sealing material 55. Sealing material 55 may be thermoplastics or thermoset resins, with the thermoset resins including silicones, phenolics, and epoxies. Prior art semiconductor packages 50 cannot be stacked on top of each other because no electrical path exists to electrically link the semiconductor on the top to a printed circuit board.

Figure 2:
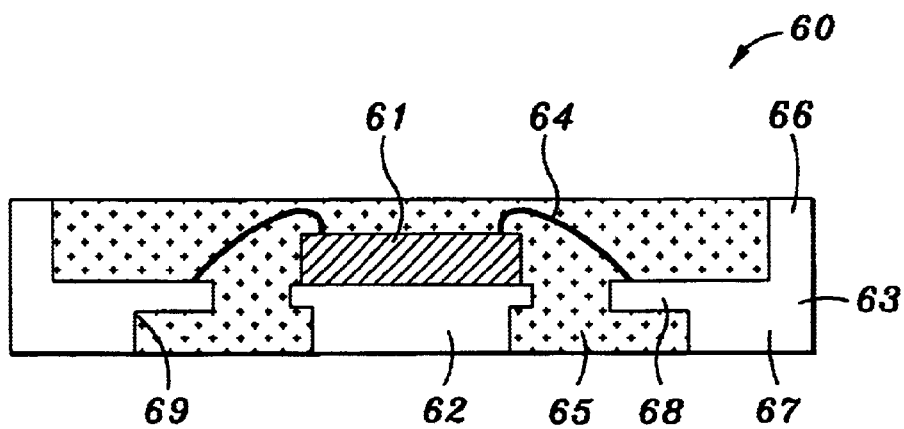
FIG. 2 is a cross-section of an embodiment of a semiconductor package constructed in accordance with the principles of an embodiment of the present invention.

Referring now to FIG. 2, there is shown a cross-section of an embodiment of a semiconductor package 60 constructed in accordance with the principles of the present invention. Semiconductor package 60 has a semiconductor chip 61, a leadframe comprising a die pad 62 and leads 63, and a plurality of wires 64. The above components are encased in a nonconductive sealing material 65 such as, for example, epoxy resin.

Still referring to FIG. 2, the leadframe will now be described in more detail. The leadframe has paddle 62 and the plurality of leads 63 all held in a spatial relationship by tie bars (not shown). The leadframe is made of a heat and electrically conductive material such as, for example, copper. Paddle 62 is of a generally flat rectangular shape, in some embodiments square, having a certain thickness. Paddle 62 may, but does not necessarily have to be, etched for better locking strength to sealing material 65. A bottom surface of paddle 62 rests flush with and is exposed to the outside of semiconductor package 60. Exposing the bottom surface of paddle 62 to the outside environment increases the heat dissipation capabilities of semiconductor package 60. The exposed portion of paddle 62 may be coated or electroplated with a corrosion-minimizing material such as, for example, tin, gold, tin lead, nickel palladium, tin bismuth or an alloy thereof The plurality of leads 63 surround, but do not touch, paddle 62. Each one of leads 63 has a top surface 66, a bottom surface 67, and an inwardly extending member 68. Top surface 66 of each one of leads 63 rests flush with the upper surface of semiconductor package 60, while bottom surface 67 of each one of leads 63 rests flush with the lower surface of semiconductor package 60. Electrical power passes through semiconductor package 60 by traveling from top surface 66 to bottom surface 67 or vice versa. The exposed portions of top surface 66 and bottom surface 67 may be coated or electroplated with a corrosion-minimizing material such as, for example, tin, gold, tin lead, nickel palladium, tin bismuth, or an alloy thereof.

A notch 69 is created by inwardly extending member 68. Notch 69 increases the locking strength between each lead of leads 63 and sealing materials and decreases the likelihood of lead or leads 63 from becoming detached from semiconductor package 60. Semiconductor chip 61 is attached to the top surface of paddle 62 by using an adhesive known in the art.

Still referring to FIG. 2, the plurality of wires 64 electrically connect semiconductor chip 61 to leads 63. Wires 64 are generally thin in dimension and are made of an electrically conductive material such as gold, silver, or aluminum. Heat generated from the operation of semiconductor chip 61 can travel through wires 64 and be dissipated to the outside environment via leads 63. Each wire of wires 64 is attached to a bond pad (not shown) on semiconductor chip 61 at one end and is attached at a second end to the inwardly extending member 68 of one of the leads 63.

Still referring to FIG. 2, sealing material 65 encapsulates leadframe 69, semiconductor chip 61, and wires 64 except for top surface 66, bottom surface 67, and the bottom surface of paddle 62. Top surface 66, bottom surface 67, the outer surface of leads 63 and the bottom surface of paddle 62 rest flush with the surface of semiconductor package 60.

Figure 3:
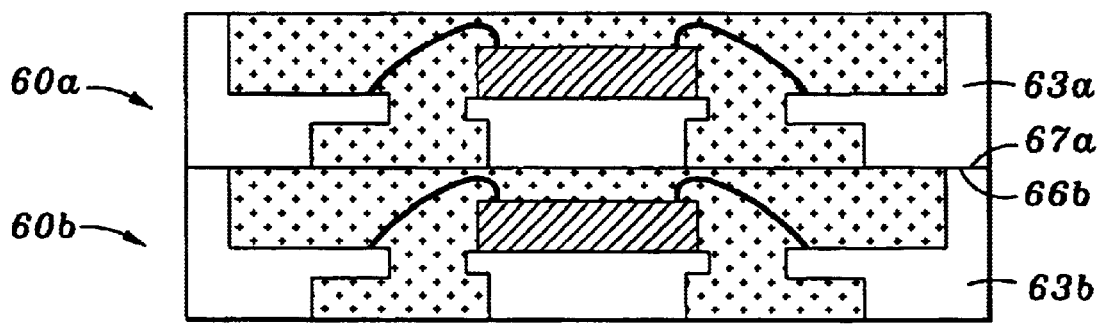
FIG. 3 is a cross-section of the semiconductor package of FIG. 2 in an exemplary stacked configuration.

Referring now to FIG. 3, there is shown semiconductor packages 60a, 60b, both embodiments of semiconductor packages 60a, 60b constructed in accordance with the principles of the present invention. Semiconductor package 60a is attached to the top of semiconductor package 60b so that leads 63a of semiconductor package 60b touch and electrically connect with leads 63b of semiconductor package 60a. When stacked onto each other, the top surface 66b of lead 63b comes into physical and electrical contact with the bottom surface 67a of lead 63a. The bottom surface of semiconductor package 60b may be attached to a printed circuit board (not shown) of an electronic device or may be attached to another semiconductor package having leads in generally the same locations. Yet another semiconductor package having leads located generally at the same place as semiconductor package 60a may be attached to the top surface of semiconductor package 60a. To physically and electrically attach semiconductor packages 60a and 60b to each other, to another semiconductor package, or to a printed circuit board, any method commonly used in the art can be used, including, but not limited to, soldering one object to the other.

Figure 4:
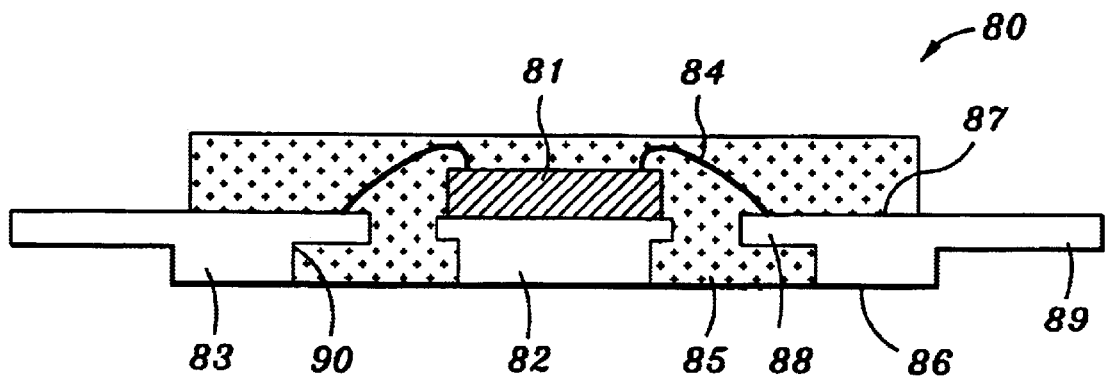
FIG. 4 is a cross-section of another embodiment of a semiconductor package constructed in accordance with the principles of the present invention.

Referring now to FIG. 4, there is shown another embodiment of a semiconductor package 80 constructed in accordance with the principles of the present invention. Semiconductor package 80 has semiconductor chip 81, a leadframe comprising die paddle 82 and leads 83, and a plurality of wires 84. These components are encapsulated using sealing material 85, which includes thermoplastics or thermoset resins, with the thermoset resins including silicones, phenolics, and epoxies.

Still referring to FIG. 4, except for the shape of the leads 83, semiconductor package 80 is constructed in generally the same manner and has generally the same components as semiconductor package 60 (FIG. 2). Each one of the leads 83 has a bottom surface 86 and a top surface 87. The bottom surface of bottom surface 86 rests flush with the bottom surface of semiconductor package 80 and is exposed to the outside environment. Top surface 87 has an inwardly extending member 88 and an outwardly extending member 89. Inwardly extending member 88 is used for attaching to the plurality of wires 84. Outwardly extending member 89 is used to electrically connect semiconductor chip 81 to a printed circuit board (not shown) just like prior art semiconductor package 50 (FIG. 1) or, as described below, is used to stack semiconductor packages 80 onto each other.

A notch 90 formed by inwardly extending member 88 increases the locking strength between leads 83 and semiconductor package 80 so as to decrease the likelihood of lead or leads 83 from becoming detached from sealing material 85. To minimize corrosion, the bottom exposed surface of paddle 82, bottom surface 86, and the outwardly extending member 89 may be coated or electroplated with a protective material, such as, for example, tin, gold, tin lead, nickel palladium, tin bismuth, or any alloy thereof in order to minimize corrosion.

Figure 5:
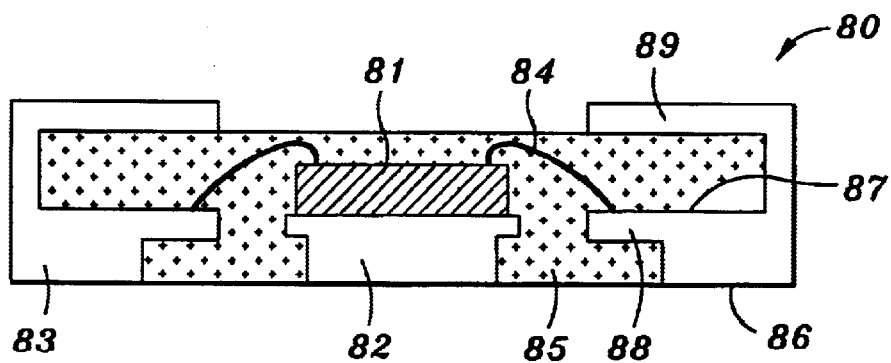
FIG. 5 is a cross-section of the embodiment of FIG. 4 constructed in accordance with the principles of the present invention after the semiconductor package has been prepared for stacking.

Referring now to FIG. 5, there is shown a cross-section of semiconductor package 80 after it has been prepared for stacking. To prepare semiconductor package 80 for stacking, outwardly extending member 89 is bent upwards and then inwards to partially wrap around the upper surface of semiconductor package 80. In this bent configuration, semiconductor package 80 now has leads 83 that extend from the bottom surface of semiconductor package 80 to the top surface of semiconductor package 80, thus providing an electrical path for electrical power to pass through semiconductor package 80 and electrically connecting with another semiconductor package located on top of semiconductor package 80.

Figure 6:
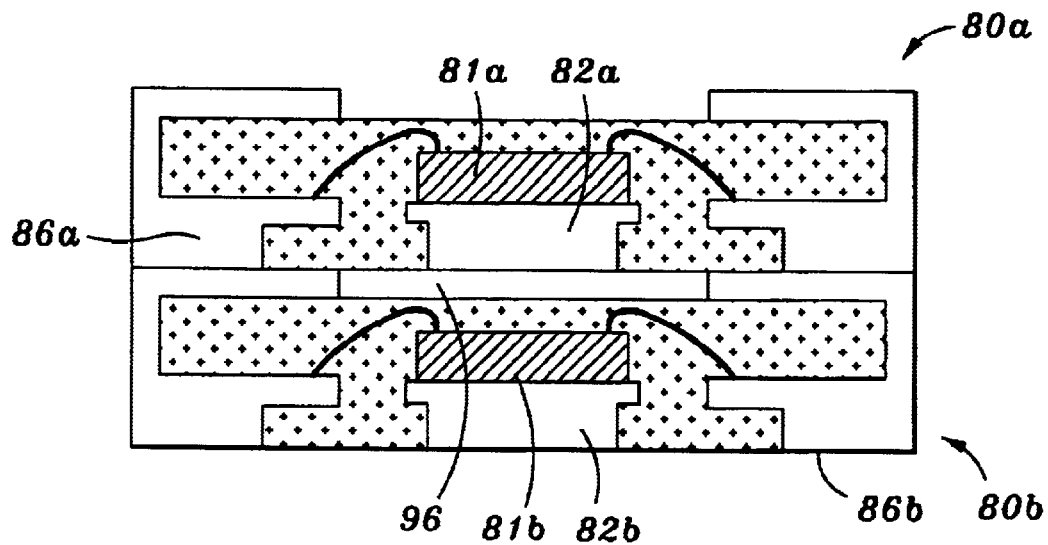
FIG. 6 is a cross-section the semiconductor package of FIG. 5 in an exemplary stacked configuration.

Referring now to FIG. 6, there is shown a cross-section of stacked semiconductor packages 80a, 80b in an exemplary configuration. Both semiconductor packages 80a, 80b are of the second embodiment of the semiconductor package 80 (FIG. 5) constructed in accordance with the principles of the present invention. When stacked onto each other, the top surface of outwardly extending member 89b comes into physical and electrical contact with the bottom surface 86a of semiconductor package 80a. In addition, a space 96 is left between semiconductor packages 80a, 80b to allow heat dissipation from the bottom surface of paddle 82a of semiconductor package 80a. Bottom surface 86b of semiconductor package 80b can be attached to a printed circuit board or another semiconductor package having leads generally located at the same place as semiconductor package 80b. Another semiconductor package (not shown) can also be stacked on top of semiconductor package 80a by following the same method as described above. The semiconductor packages are held in this stacked position by applying solder—or any other material commonly used in the art—between the semiconductor packages and/or between a semiconductor package and a printed circuit board.

Figure 7:
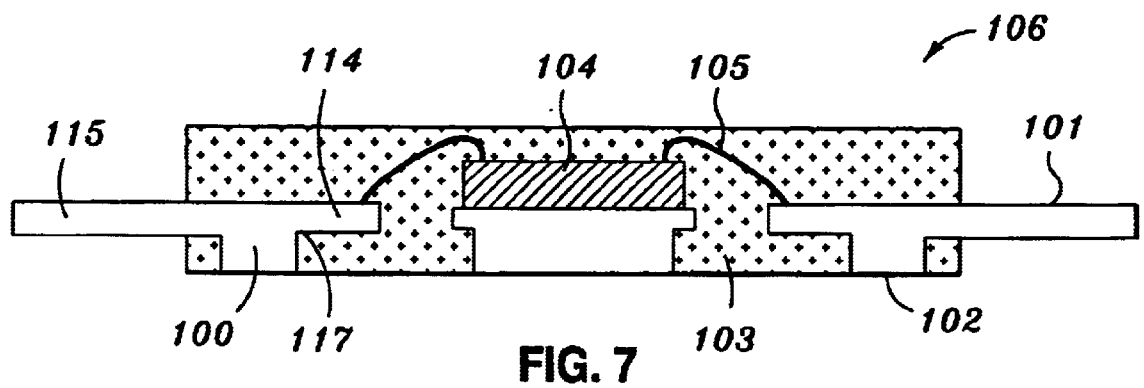
FIG. 7 is a cross-section of another embodiment of another embodiment of a semiconductor package constructed in accordance with the principles of the present invention.

Referring now to FIG. 7, there is shown a cross-section of another embodiment of a semiconductor package 106 constructed in accordance with the principles of the present invention. The location of leads 100 in semiconductor package 106 differs from the location of leads in the embodiments previously described. Each one of the leads 100 has a top surface 101 and a bottom surface 102. A lower portion of lead 100 is completely encased in sealing material 103 except for a bottom surface 102 that is resting flush with the bottom surface of semiconductor package 106. The bottom surface 102 is exposed to the outside to allow electrical contact with a printed circuit board or with another semiconductor package (not shown) having leads located at generally the same place as semiconductor package 106. To minimize corrosion, the bottom surface 102 is coated or electroplated with a protective material such as, for example, tin, gold, tin lead, nickel palladium, or an alloy thereof.

Top surface 101 has an inwardly extending member 114 and an outwardly extending member 115. Inwardly extending member 114 connects to integrated circuit chip 104 through wires 105. Inwardly extending member 114 also creates notch 117. Notch 117 increases the locking strength between leads 100 and semiconductor package 106 and decreases the likelihood of leads 100 becoming detached from sealing material 103.

A small portion of the outwardly extending member 115 is encased in sealing material 103 for increasing locking strength, but the majority portion of outwardly extending member 115 is exposed to the outside for connection to a printed circuit board or as described below, for stacking semiconductor packages 106 onto each other. The exposed portion of outwardly extending member 115 is coated or electroplated with a protective material, including, but not limited to, tin, gold, tin lead, nickel palladium, or an alloy thereof to minimize corrosion.

Figure 8:
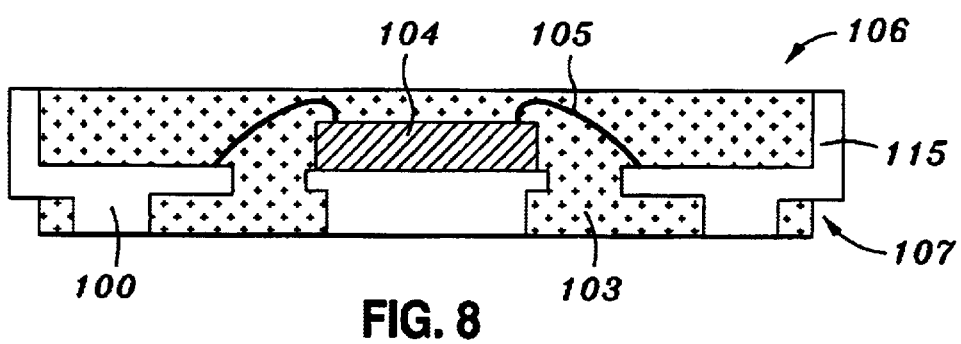
FIG. 8 is a cross-section of the embodiment of FIG. 7 constructed in accordance with the principles of the present invention after the semiconductor package has been prepared for stacking.

Referring now to FIG. 8, there is shown a cross-section of semiconductor package 106 with the exposed section of outwardly extending member 115 bent upwards. An outside notch 107 (FIG. 7) is formed by this bending of outwardly extending member 115. Outwardly extending member 115 may rest flush with the top surface of semiconductor package 106 or protrude slightly upwards as shown in semiconductor package 108 of FIG. 9. In this bent configuration, semiconductor package 106 now has leads 100 that extend from the bottom surface to the top surface of semiconductor package 106, thus providing an electrical path through semiconductor package 106 and allows for electrically connecting with another semiconductor package to semiconductor package 106.

Figure 9:
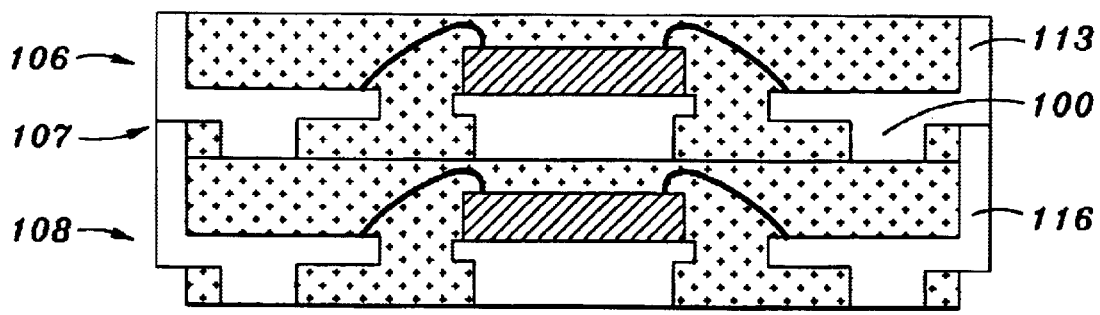
FIG. 9 is a cross-section of the semiconductor package of FIG. 8 in an exemplary stacked configuration.

Referring now to FIG. 9, there is shown a cross-section of the semiconductor package of FIG. 8 in an exemplary stacked configuration. Semiconductor package 106 is placed on top of semiconductor package 108. A portion of the outwardly extending member 116 protruding from of the top surface of semiconductor package 108 fits into notch 107 (FIG. 7) of semiconductor package 106. Top surface 113 of lead 100 rests flush with the top surface of semiconductor package 106.

Another semiconductor package of the present invention having leads generally in the same place as semiconductor package 106 may be stacked on top of semiconductor package 106. Another semiconductor package having generally the same configuration as semiconductor package 108 can be stacked underneath semiconductor package 108. Alternatively, a printed circuit board can be attached to the bottom surface of semiconductor package 108. The semiconductor packages are held together in this stacked position by applying solder—or any other material commonly used in the art—between the semiconductor packages and/or between a semiconductor package and a printed circuit board.

Figure 10:
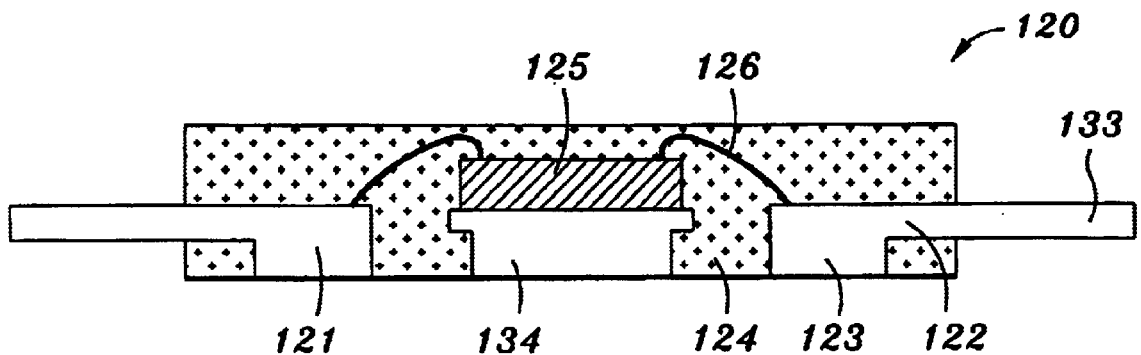
FIG. 10 is a cross-section of another embodiment of a semiconductor package constructed in accordance with the principles of the present invention.

Referring now to FIG. 10, there is shown a cross-section of another embodiment of a semiconductor package 120 constructed in accordance with the principles of the present invention. Semiconductor package 120 has generally the same components as the embodiments of the present invention already discussed above, including leads 121 that can extend from the bottom surface of semiconductor package 120 to the top surface of semiconductor package 120. However, leads 121 are shaped differently. Each lead or leads 121 has a top portion 122 and bottom portion 123. Bottom portion 123 is enclosed in sealing material 124 except for the very bottom surface, which is exposed to the outside for electrical contact.

Top portion 122 provides a surface for semiconductor chip 125 to physically and electrically connect to leads 121 through a plurality of wires 126. Top portion 122 also has an outwardly extending member 133. Though a portion of outwardly extending member 133 is enclosed in sealing material 124 for better locking strength between leads 121 and sealing material 124, a large part of outwardly extending member 133 is exposed to the outside of semiconductor package 120. If no other semiconductor package is stacked on top of semiconductor package 120, outwardly extending member 133 can be electrically connected to a printed circuit board. Both the outwardly extending member 133 and the bottom surface 123 and paddle 134 are coated or electroplated with a protective material such as, for example, tin, gold, tin lead, nickel palladium, tin bismuth, or any alloy thereof in order to minimize corrosion.

Figure 11:
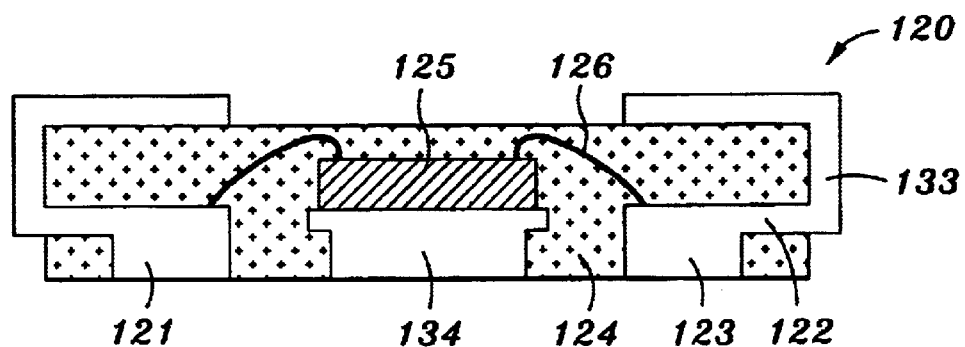
FIG. 11 is a cross-section of the embodiment of FIG. 10 constructed in accordance with the principles of the present invention after the semiconductor package has been prepared for stacking.
Figure 12:
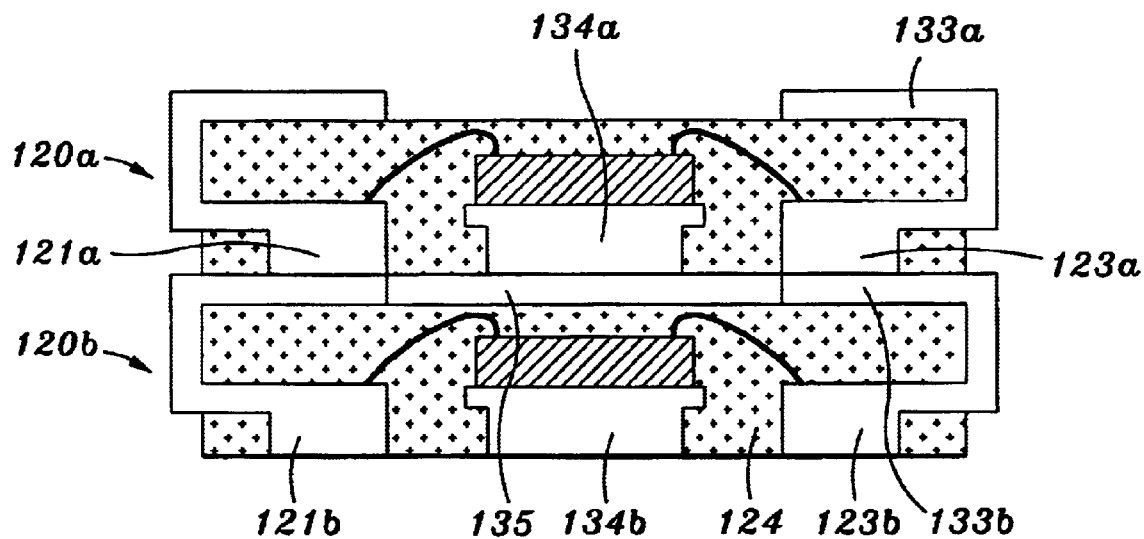
FIG. 12 is a cross-section of the semiconductor package of FIG. 10 in an exemplary stacked configuration.

Referring now to FIG. 11, there is shown a cross-section of semiconductor package 120, with the outwardly extending member 133 of top portion 122 bent upwards and then partially wrapped around the top surface of semiconductor package 120. Once the outwardly extending member 133 is wrapped around semiconductor package 120, semiconductor package 120 can be stacked onto another similar semiconductor package as shown in FIG. 12. In this bent configuration, semiconductor package 120 now has leads 121 that extend from the bottom surface to the top surface of semiconductor package 120, thus providing an electrical path through semiconductor package 120 and powering another semiconductor package located on top of semiconductor package 120.

Referring now to FIG. 12, there is shown a cross-section of semiconductor package 120a stacked onto semiconductor package 120b. Leads 121b of the semiconductor package 120b are physically and electrically connected to leads 121a of semiconductor package 120a. When stacked onto each other, the bent-outwardly extending member 133b of semiconductor package 120b comes into physical and electrical contact with the bottom portion 123a of semiconductor package 120a.

A space 135 is left between semiconductor packages 120a and 120b to allow for heat dissipation from the bottom surface of paddle 134a. Another semiconductor package having leads at generally the same place as semiconductor package 120a can be placed on top of semiconductor package 120a. Semiconductor package 120b can also be placed on top of another semiconductor package or be physically and electrically connected to a printed circuit board. Again, the semiconductor packages are held in this stacked position by applying solder—or any other material commonly used in the art—between the semiconductor packages and/or between a semiconductor package and a printed circuit board.

Figure 13:
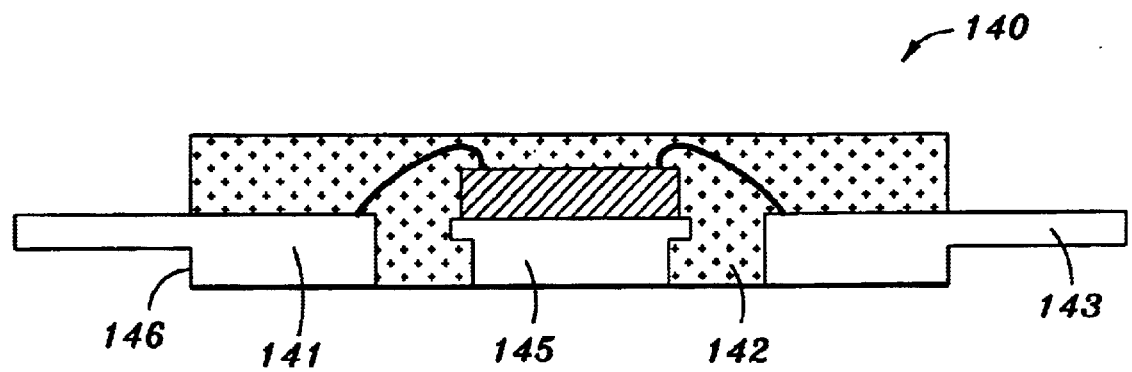
FIG. 13 is a cross-section of another embodiment of a semiconductor package constructed in accordance with the principles of the present invention.
Figure 14:
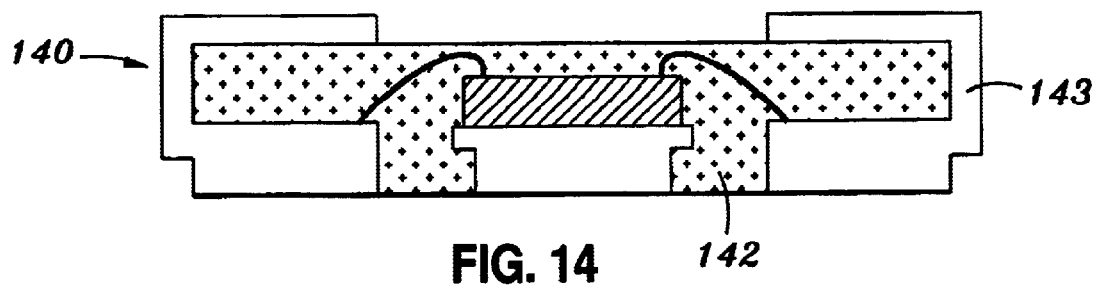
FIG. 14 is a cross-section of the embodiment of FIG. 13 constructed in accordance with the principles of the present invention after the semiconductor package has been prepared for stacking.
Figure 15:
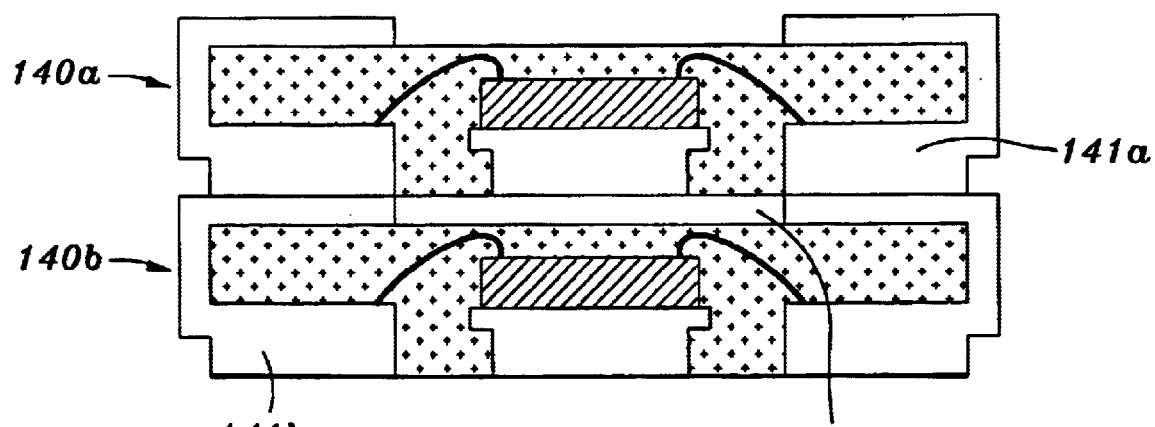
FIG. 15 is a cross-section of the semiconductor package of FIG. 13 in an exemplary stacked configuration.

Referring now to FIGS. 13–15, there is shown cross-sections of another embodiment of a semiconductor package 140 constructed in accordance with the principles of the present invention. Semiconductor package 140 is similar in construction to semiconductor package 120 of the previous embodiment. However, leads 141 of semiconductor package 140 are not completely enclosed by sealing material 142, but rather also have an exposed lateral surface 146. Leads 141 also have an outwardly extending member 143 which, as seen in FIG. 14, can be partially wrapped around the top surface of semiconductor package 140. Semiconductor packages 140a, 140b having leads in generally the same place as semiconductor package 140 can be stacked and affixed onto each other as shown in FIG. 15, with the leads 141a and 141b providing the physical and electrical contact between, the semiconductor packages and with the space 144 between the semiconductor packages allowing heat dissipation from the bottom surface of paddle 145. Note if no other semiconductor package is stacked on top of semiconductor package 140a, outwardly extending members 143 can be electrically connected to a printed circuit board.

Figure 16:
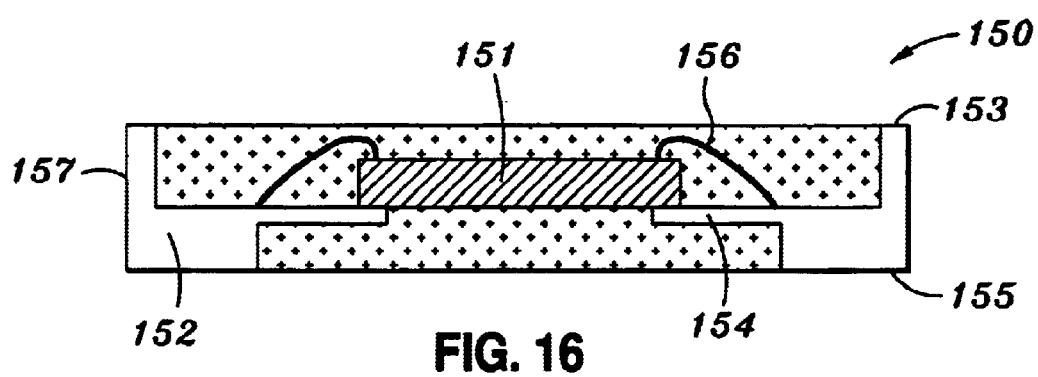
FIG. 16 is a cross-section of another embodiment of a semiconductor package constructed in accordance with the principles of the present invention.

Referring now to FIG. 16, there is shown a cross-section of another embodiment of a semiconductor package 150 constructed in accordance with the principles of the present invention. Except for a paddle, semiconductor package 150 has all the components of the previously disclosed embodiments of the semiconductor packages constructed in accordance with the principles of the present invention. The semiconductor chip 151 of semiconductor package 150 is supported on a bottom surface by a plurality of leads 152.

Each one of leads 152 has a top surface 153, an inwardly extending member 154, and a bottom surface 155. Semiconductor chip 151 is attached to a top surface of inwardly extending member 154. Semiconductor chip 151 is electrically connected to leads 152 through a plurality of wires 156. The bottom surface 155 rests flush with a bottom surface of semiconductor package 150 and the top surface 153 rests flush with a top surface of semiconductor package 150. A lateral surface 157 of each lead 152 is also exposed to the outside of semiconductor package 150. All the exposed parts of leads 152 are coated or electroplated with a corrosion-minimizing material such as, for example, tin, gold, tin lead, tin bismuth, nickel palladium, or an alloy thereof. Because leads 152 extend from the bottom surface of semiconductor package 150 to the top of semiconductor package 150, leads 152 provide an electrical path through semiconductor package 150 and can electrically connect to another semiconductor package located on top of semiconductor package 150.

Figure 17:
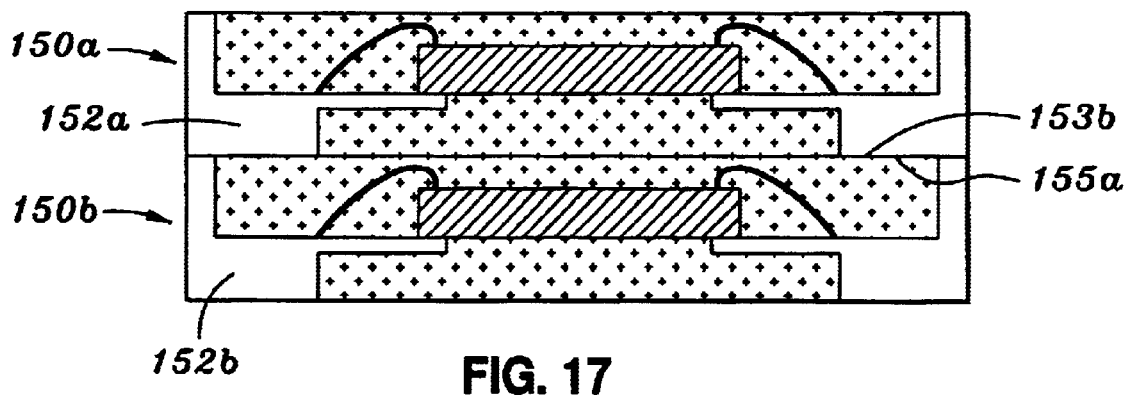
FIG. 17 is a cross-section of the semiconductor package of FIG. 16 in an exemplary stacked configuration.

Referring now to FIG. 17, there is shown a cross-section of semiconductor packages in a stacked configuration. Semiconductor package 150a is stacked on top of semiconductor package 150b, with leads 152b in semiconductor package 150b physically and electrically connecting to leads 152a of semiconductor package 150a. When stacked onto each other, the top surface 153b of lead 152b comes into physical and electrical contact with the bottom surface 155a of lead 152a.

Another semiconductor package having leads in generally the same place as semiconductor package 150*a* can be stacked and then affixed to the top of semiconductor package 150*a*. Similarly, semiconductor package 150*b* can be physically affixed to and electrically connected with a printed circuit board or be stacked and affixed on top of another semiconductor package having leads in generally the same place. The semiconductor packages are held in this stacked position by applying solder—or any other material commonly used in the art—between the semiconductor packages and/or between a semiconductor package and a printed circuit board.

Figure 18:
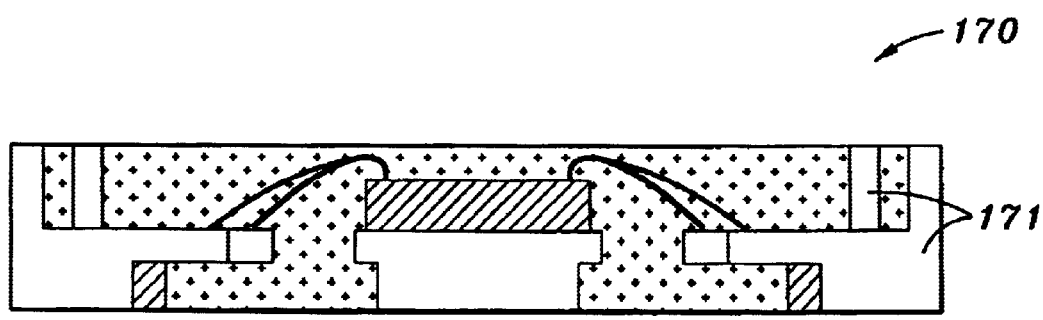
FIG. 18 is a cross-section of another embodiment of a semiconductor package constructed in accordance with the principles of the present invention.

Referring now to FIG. 18, there is shown a cross-section of another embodiment of a semiconductor package 170 constructed in accordance with the principles of the present invention. Semiconductor package 170 is similar in construction to the first embodiment of the present invention. However, leads 171 in semiconductor package 170 are staggered so that leads 171 are not placed next to each other. This staggered configuration can reduce electrical shorts caused by the close physical proximity of the leads. This staggered configuration can be applied to the leads in each one of the previously described embodiments of the semiconductor package constructed in accordance with the principles of the present invention.

The method for manufacturing the present invention will now be discussed using an exemplary embodiment.

Referring back to FIG. 2, there is shown semiconductor package 60. To manufacture semiconductor package 60, first, semiconductor chip 61 is attached to paddle 62 by using an adhesive. Note, in the semiconductor package of the embodiment of FIG. 16, the semiconductor chip is supported by leads instead of a paddle and so the semiconductor chip of the embodiment would be attached to the leads at this step. After attaching semiconductor chip 61 to paddle 62, the semiconductor chip 61 is electrically connected to leads 63 via wires 64 using any wire bonding method known in the art. A sealing material 65 is then transfer molded onto the lead frame, semiconductor chip 61, and wires 64. The sealing material 65 is then allowed to cool and harden. After the hardening process, excess sealing material 65 is trimmed off either manually or by using a trimming machine. At the same time, leads 63 are also trimmed to their final length. The exposed portions of the leads 63 are then coated or electroplated with a corrosion-minimizing material such as, for example, tin or gold. For the semiconductor packages of the other embodiments, if the semiconductor packages are to be stacked, an additional lead-bending step can now be performed.

The following applications are being filed on the same date as the present application and all are incorporated by reference as if wholly rewritten entirely herein, including any additional matter incorporated by reference therein.

| Application Number | Title of Application | First Named Inventor |
|---|---|---|
| 09/687,485 | Semiconductor Package Having Increased Solder Joint Strength | Kil Chin Lee |
| 09/687,487 | Clamp and Heat Block Assembly for Wire Bonding a Semiconductor Package Assembly | Young Suk Chung |
| 09/687,876 | Near Chip Size Semiconductor Package | Sean Timothy Crowley |
| 09/687,495 | Semiconductor Package | Sean Timothy Crowley |
| 09/687,531 | Stackable Semiconductor Package and Method for Manufacturing Same | Sean Timothy Crowley |
| 09/687,126 | Method of and Apparatus for Manufacturing Semiconductor Packages | Hyung Ju Lee |
| 09/687,493 | Semiconductor Package Having Improved Adhesiveness and Ground Bonding | Sung Sik Jang |
| 09/687,541 | Semiconductor Package Leadframe Assembly and Method of Manufacture | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the invention.

Although a preferred embodiment of the method and apparatus of the present invention has been illustrated in the accompanying drawings and described in the foregoing detailed description, it will be understood that the invention is not limited to the embodiment disclosed, but is capable of numerous rearrangements, modifications, and substitutions without departing from the spirit of the present invention as set forth and defined by the following claims.

What is claimed is:

1. A semiconductor package for a semiconductor chip, said semiconductor package comprising:
    a plurality of L-shaped leads, each of said plurality of L-shaped leads having a top portion exposed on a top surface of said semiconductor package, a bottom portion exposed in and substantially flush with a bottom surface of said semiconductor package, and an inwardly extending member which is disposed between the top and bottom portions and partially defines a notch;
    a plurality of electrical paths electrically connecting said semiconductor chip to said L-shaped leads; and
    sealing material applied to said leads, said semiconductor chip, and said electrical paths, said sealing material filling said notch of each of said L-shaped leads.

2. The semiconductor package of claim 1, further comprising:
    a chip paddle having a bottom surface exposed in and substantially flush with said bottom surface of said semiconductor package.

3. The semiconductor package of claim 2 wherein said L-shaped leads are arranged in at least one single line surrounding said chip paddle.

4. The semiconductor package of claim 2 wherein said L-shaped leads are randomly dispersed in a plurality of lines surrounding said chip paddle.

5. The semiconductor package of claim 1 wherein said top portion of each of said L-shaped leads is flush with said top surface of said semiconductor package.

6. The semiconductor package of claim 1 wherein said top portion of each of said L-shaped leads extends generally perpendicularly from a bottom surface of said semiconductor chip.

7. The semiconductor package of claim 1 wherein said top portion and said bottom portion of each of said L-shaped leads is electroplated.

8. The semiconductor package of claim 1 wherein said electrical paths are a plurality of conductive wires.

9. The semiconductor package of claim 8 wherein said conductive wires are selected from the group consisting of: silver, gold, and aluminum.

10. A method for stacking semiconductor packages, comprising the steps of:

physically and electrically connecting a bottom side of a first semiconductor package to a printed circuit board, said first semiconductor package having a plurality of first L-shaped leads, each of said first L-shaped leads having a first section exposed on a first top surface of said first semiconductor package, a second section exposed in and substantially flush with a first bottom surface of said first semiconductor package, and an inwardly extending member disposed between said first and second sections and partially defining a notch which is filled with a sealing material applied to said first L-shaped leads and said semiconductor; and physically and electrically connecting a second semiconductor package to said first top surface of said first semiconductor package, said second semiconductor package having a plurality of second L-shaped leads in generally the same position as said first L-shaped leads.

11. The method for stacking semiconductor packages as in claim 10 wherein said first semiconductor package is soldered to said printed circuit board.

12. A method for stacking semiconductor packages as in claim 10 wherein said second semiconductor package is soldered to said first semiconductor package.

13. The method for stacking semiconductor packages as in claim 10 wherein said first section of each of said first L-shaped leads is substantially flush with said first top surface of said first semiconductor package.

14. A method for manufacturing a semiconductor package, comprising the steps of:

attaching a semiconductor chip to a paddle of a lead frame, said lead frame having a plurality of L-shaped leads surrounding said paddle;

electrically connecting said semiconductor chip to each of said L-shaped leads via a plurality of wires;

applying a sealing material to said semiconductor chip, said lead frame, and said wires, said sealing material forming a top side and a bottom side of said semiconductor package, with a first section of each of said L-shaped leads being exposed on said top side of said semiconductor package, a second section of each of said L-shaped leads being exposed in and substantially flush with said bottom side of said semiconductor package, and a notch partially defined by an inwardly extending member of each of said L-shaped leads being filled with said sealing material; and trimming off a portion of said lead frame and said sealing material.

15. The method for manufacturing a semiconductor package as in claim 13 wherein said first section of each of said L-shaped leads is substantially flush with said top side of said semiconductor package.

16. A semiconductor package for a semiconductor chip, the semiconductor package comprising:

a plurality of leads, each of the leads having a top surface, a bottom surface, and an inwardly extending member which is disposed between the top and bottom surfaces and partially defines a notch;

a semiconductor chip electrically connected to at least one of the leads; and a sealing material applied to the leads and the semiconductor chip such that the top surface of each of the leads is exposed in and substantially flush with an exterior surface of the sealing material, the bottom surface of each of the leads is exposed in and substantially flush with the exterior surface, and the notch of each of the leads is filled with the sealing material.

17. The semiconductor package of claim 16 wherein the semiconductor chip at least partially overlaps and is rested upon the inwardly extending member of each of the leads.

18. The semiconductor package of claim 16 wherein the semiconductor chip is electrically connected to each of the leads through the use of wires which are covered by sealing material.

19. The semiconductor package of claim 16 wherein each of the leads has a generally L-shaped configuration including a top portion which defines the top surface and a bottom portion which defines the bottom surface, the notch being collectively defined by the inwardly extending member and the bottom portion.

20. The semiconductor package of claim 16 further comprising a chip paddle having a bottom surface which is exposed in and substantially flush with the exterior surface of the sealing material, the semiconductor chip being positioned upon the chip paddle.

21. A semiconductor package for a semiconductor chip, the semiconductor package comprising:

a plurality of leads, each of the leads having a top surface and a bottom surface;

a semiconductor chip electrically connected to at least one of the leads;

a sealing material applied to the leads and the semiconductor chip such that the top surface of each of the leads is exposed in and substantially flush with an exterior surface of the sealing material, and the bottom surface of each of the leads is exposed in and substantially flush with the exterior surface; and means formed within each of the leads for increasing the locking strength between the leads and the sealing material.

* * * * *